United States Patent
Yang et al.

(10) Patent No.: US 10,384,434 B2
(45) Date of Patent: Aug. 20, 2019

(54) SEPARATING DEVICE AND SEPARATING METHOD

(71) Applicants: Industrial Technology Research Institute, Hsinchu (TW); Intellectual Property Innovation Corporation, Hsinchu (TW)

(72) Inventors: Chen-Tsai Yang, Taoyuan (TW); Ko-Chin Yang, Taipei (TW); Shi-Chang Chen, Hualien County (TW); Cheng-Yi Wang, Hsinchu County (TW); Yen-Ting Wu, Taoyuan (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/956,770

(22) Filed: Apr. 19, 2018

(65) Prior Publication Data
US 2019/0061332 A1    Feb. 28, 2019

Related U.S. Application Data

(60) Provisional application No. 62/552,404, filed on Aug. 31, 2017.

(30) Foreign Application Priority Data

Dec. 28, 2017    (TW) .............................. 106146205 A

(51) Int. Cl.
B32B 43/00        (2006.01)
H01L 51/00        (2006.01)
B32B 38/10        (2006.01)

(52) U.S. Cl.
CPC .......... *B32B 43/006* (2013.01); *H01L 51/003* (2013.01); *B32B 38/10* (2013.01);
(Continued)

(58) Field of Classification Search
CPC . B32B 38/10; B32B 43/006; Y10T 156/1168; Y10T 156/1978
(Continued)

(56) References Cited

U.S. PATENT DOCUMENTS 8,376,017 B2    2/2013   Lee et al.
8,852,391 B2   10/2014   McCutcheon et al.
(Continued)

FOREIGN PATENT DOCUMENTS

CN    102856252    1/2013
CN    106067429   11/2016
(Continued)

OTHER PUBLICATIONS

"Office Action of Taiwan Counterpart Application", dated Dec. 7, 2018, p. 1-p. 5.

*Primary Examiner* — Mark A Osele
*Assistant Examiner* — Nickolas R Harm
(74) *Attorney, Agent, or Firm* — JCIPRNET

(57)  ABSTRACT

A separating device includes a separating unit and a crack front line adjusting unit. The separating unit is adapted to separate the flexible film and the substrate. During the process of separating the flexible film from the substrate, a crack front line is formed between a portion of the flexible film not separated from the substrate and a portion of the flexible film separated from the substrate. The crack front line adjusting unit is adapted to sense a relative displacement state of the flexible film and the substrate for determining a distribution of the crack front line, and is adapted to apply a down pressing force to the flexible film or the substrate and
(Continued)

increase or decrease the down pressing force according to the relative displacement state, so as to adjust the distribution of the crack front line.

17 Claims, 11 Drawing Sheets

(52) U.S. Cl.
CPC ...... *B32B 2309/12* (2013.01); *Y10T 156/1168* (2015.01); *Y10T 156/1978* (2015.01)
(58) Field of Classification Search
USPC .................................................. 156/714, 764
See application file for complete search history.

(56) References Cited

U.S. PATENT DOCUMENTS

| | | | |
|---|---|---|---|
| 9,010,398 B2 | 4/2015 | Kweon et al. | |
| 9,111,983 B1 | 8/2015 | Ginter et al. | |
| 9,427,949 B2 | 8/2016 | Ohno et al. | |
| 9,475,270 B2 | 10/2016 | Xie et al. | |
| 9,604,443 B2* | 3/2017 | Sun | B32B 37/0053 |
| 2011/0155328 A1* | 6/2011 | Kobayashi | H01L 21/67132 156/702 |
| 2011/0198040 A1* | 8/2011 | Ebata | B65H 41/00 156/750 |
| 2012/0312481 A1* | 12/2012 | Kang | B29C 63/0013 156/715 |
| 2014/0008022 A1* | 1/2014 | Ahn | B29C 69/006 156/378 |
| 2015/0003024 A1 | 1/2015 | Huang et al. | |
| 2016/0207732 A1* | 7/2016 | Park | B65H 41/00 |
| 2017/0326865 A1* | 11/2017 | Ayabe | B32B 38/10 |

FOREIGN PATENT DOCUMENTS

| | | |
|---|---|---|
| TW | 201431768 | 8/2014 |
| TW | 201604018 | 2/2016 |
| TW | I581357 | 5/2017 |

* cited by examiner

SEPARATING DEVICE AND SEPARATING METHOD

CROSS-REFERENCE TO RELATED APPLICATION

This application claims the priority benefit of U.S. provisional application Ser. No. 62/552,404, filed on Aug. 31, 2017 and the priority benefit of Taiwan application serial no. 106146205, filed on Dec. 28, 2017. The entirety of each of the above-mentioned patent applications is hereby incorporated by reference herein and made a part of this specification.

TECHNICAL FIELD

The disclosure relates to a separating device and a separating method.

BACKGROUND

In recent years, the semiconductor-related industries gradually advance along with growing demand for more power functions, faster signal transmission speeds, and increasing density of circuit elements of the electronic products. In the semiconductor package manufacturing process adopted by the semiconductor industry, the unsingulated flexible film (e.g., a package structure) is formed on a temporary substrate, and the flexible film is then separated from the substrate.

FIG. 1A and FIG. 1B illustrate how a flexible film is separated from a substrate in a general package manufacturing process. FIG. 1A is a top view illustrating a flexible film being separated from a substrate in a general package manufacturing process. FIG. 1B is a side view of the flexible film and the substrate of FIG. 1A. As illustrated in FIG. 1A and FIG. 1B, during a process of separating a flexible film 50 from a substrate 60, since a considerable weak total combining force is obtained between an edge 52 of the flexible film 50 and the substrate 60, a separating progress at the edge 52 is faster than a separating progress at a central area of the flexible film 50. As such, a crack front line R1 (i.e., a boundary line between a portion 50b of the flexible film 50 not separated from the substrate 60 and a portion 50a of the flexible film 50 separated from the substrate 60) may become a curve line easily as shown in FIG. 1A. An excessive warpage may be generated in the flexible film 50 resulted from such uneven separating progress, and a stress concentration structure, such as a conductive structure, in the flexible film 50 is subjected to excessively great concentration stress, and a structural strength of the stress concentration structure is thereby damaged. In addition, uneven thickness of the flexible film 50 or the substrate 60 generated during the manufacturing process may also lead to uneven separating progress.

SUMMARY

In an embodiment of the disclosure, a separating device is adapted to separate a flexible film from a substrate. The separating device includes a separating unit and a crack front line adjusting unit. The separating unit is adapted to apply a pull force to at least one of the flexible film and the substrate such that the flexible film and the substrate are separated from each other. During the process of separating the flexible film from the substrate, a crack front line is formed between a portion of the flexible film not separated from the substrate and a portion of the flexible film separated from the substrate. The crack front line adjusting unit includes at least one displacement sensing element and at least one pressure applying element. The at least one displacement sensing element is adapted to sense a relative displacement state of the flexible film and the substrate for determining a distribution of the crack front line. The at least one pressure applying element is adapted to apply a down pressing force to the flexible film or the substrate and increase or decrease the down pressing force according to the relative displacement state, so as to adjust the distribution of the crack front line.

In an embodiment of the disclosure, a separating method is adapted to separate a flexible film from a substrate. The separating method includes steps as follows. A separating unit applies a pull force to at least one of the flexible film and the substrate through such that the flexible film and the substrate are separated from each other. During the process of separating the flexible film from the substrate, a crack front line is formed between a portion of the flexible film not separated from the substrate and a portion of the flexible film separated from the substrate. At least one displacement sensing element senses a relative displacement state of the flexible film and the substrate for determining a distribution of the crack front line. At least one pressure applying element applies a down pressing force to the flexible film or the substrate, wherein the at least one pressure applying element increases or decreases the down pressing force according to the relative displacement state, so as to adjust the distribution of the crack front line.

Several embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
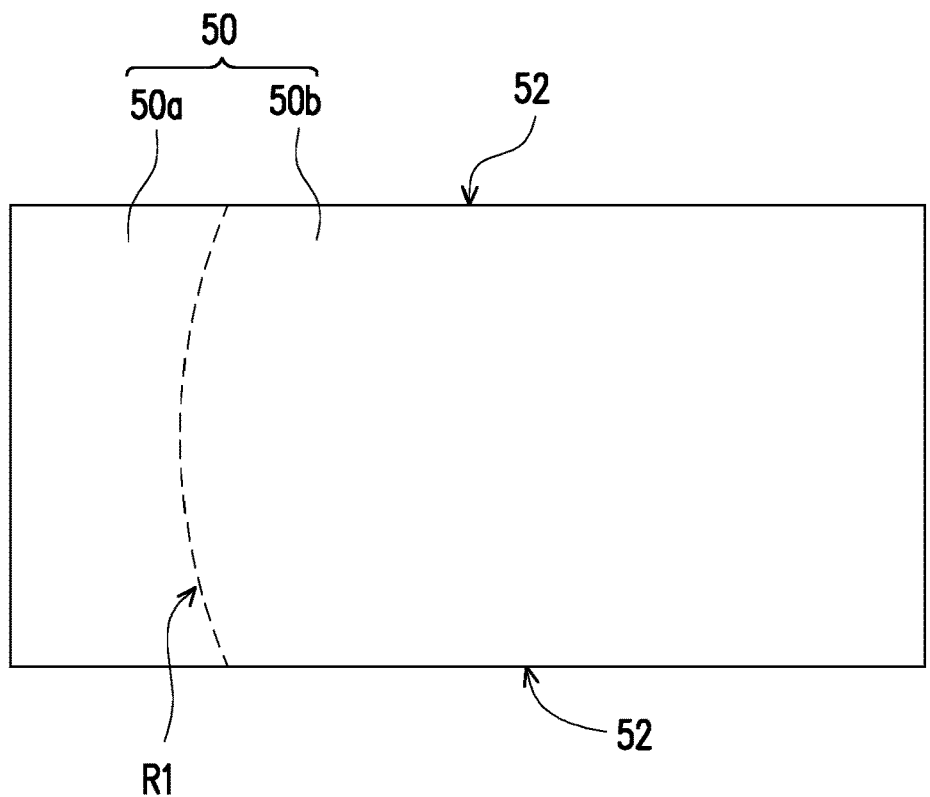
FIG. 1A is a top view illustrating a flexible film being separated from a substrate in a general package manufacturing process.
Figure 1B:
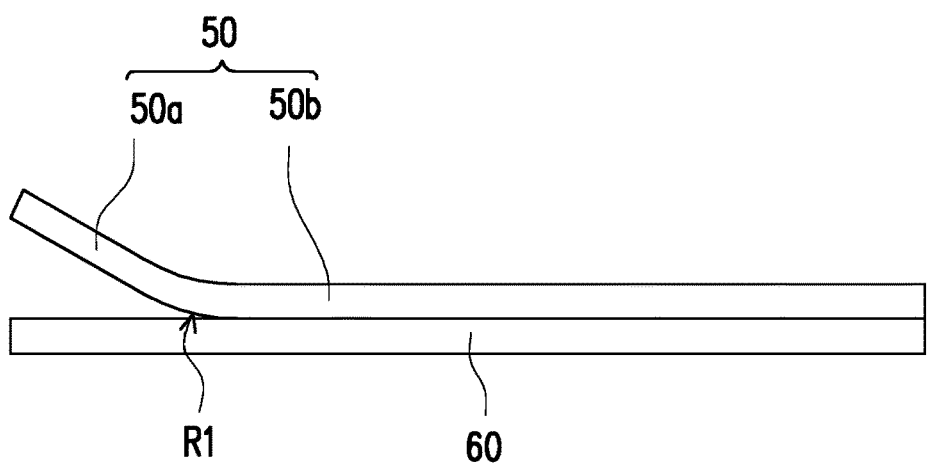
FIG. 1B is a side view of the flexible film and the substrate of FIG. 1A.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
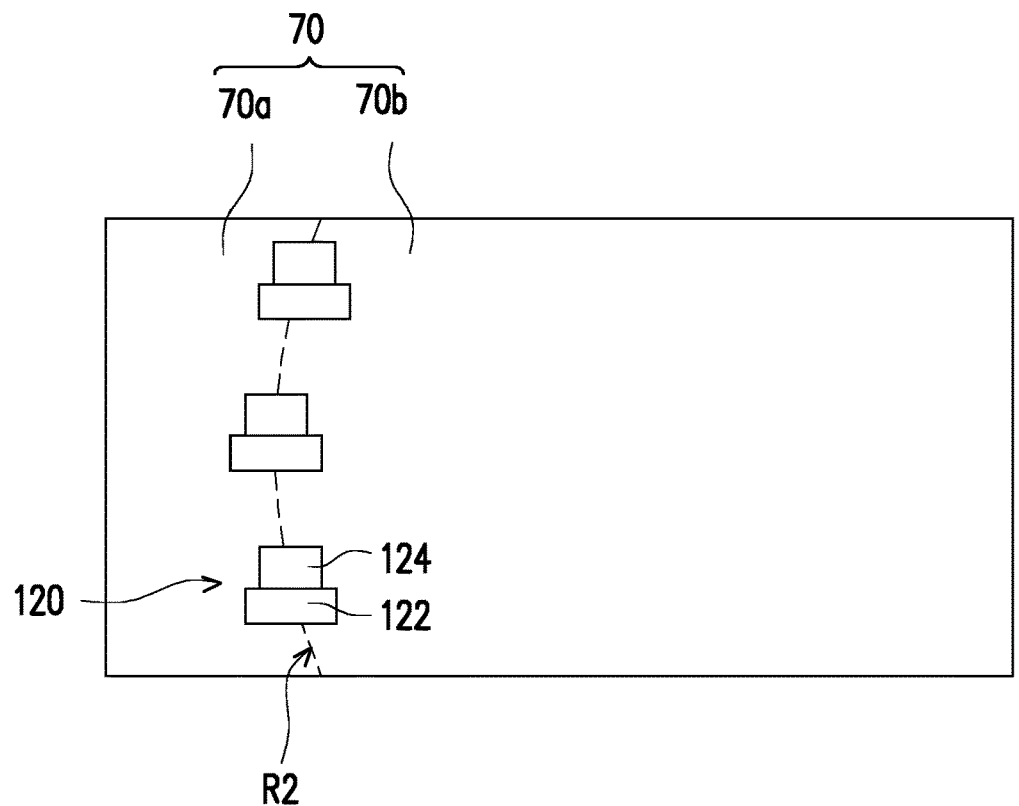
FIG. 2A is a schematic top view of separating a flexible film from a substrate by a separating device according to an embodiment of the disclosure.
Figure 2B:
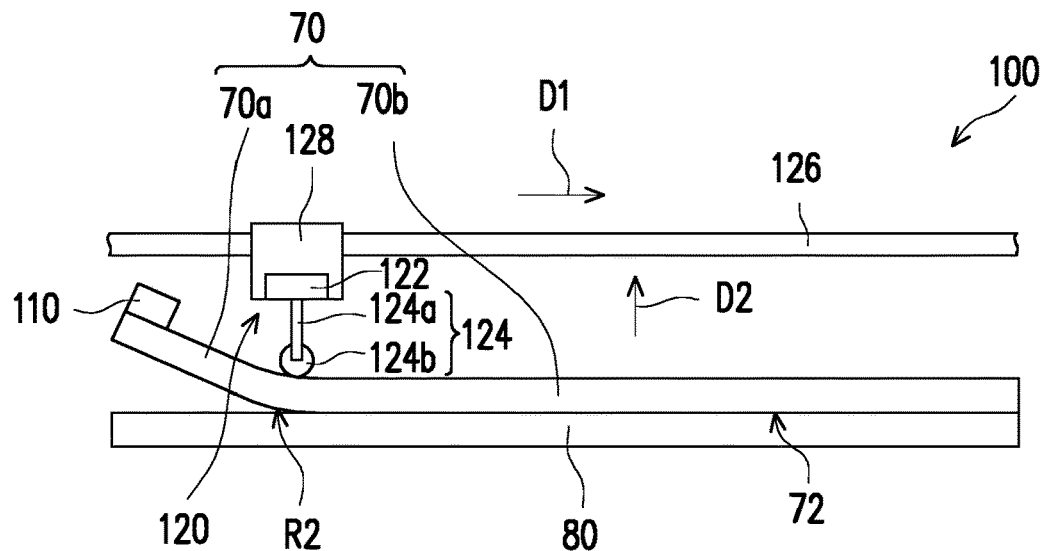
FIG. 2B is a schematic side view of the separating device, the flexible film, and the substrate of FIG. 2A.

FIG. 2A is a schematic top view of separating a flexible film from a substrate by a separating device according to an embodiment of the disclosure. FIG. 2B is a schematic side view of the separating device, the flexible film, and the substrate of FIG. 2A. In order to have a clearer figure, only part of members of the separating device of FIG. 2B are illustrated in FIG. 2A. With reference to FIG. 2A and FIG. 2B, a separating device 100 of this embodiment includes a separating unit 110 and a crack front line adjusting unit 120. The separating unit 110 is adapted to apply a pull force to a substrate 70, such that the substrate 70 and a flexible film 80 are separated from each other.

The separating unit 110 is, for example, a suitable mechanical unit capable of applying the pull force to the substrate 70, which is not limited by the disclosure. Besides, in other embodiments, the separating unit 110 may apply the pull force to the flexible film 80 instead or simultaneously apply the pull force to the substrate 70 as well as the flexible film 80, such that the substrate 70 and the flexible film 80 are separated from each other. Further, a sucker may be disposed on the substrate 70 or the flexible film 80. The sucker is attached to the substrate 70 or the flexible film 80, and the separating unit 110 applies the pull force to the sucker such that the substrate 70 and the flexible film 80 are separated from each other. That is, the disclosure is not intended to limit the pull force to be directly or indirectly applied to the substrate 70 or the flexible film 80 by the separating unit 110.

During the process of separating the substrate 70 from the flexible film 80, a crack front line R2 is formed between a portion 70b of the substrate 70 not separated from the flexible film 80 and a portion 70a of the substrate 70 separated from the flexible film 80. The crack front line adjusting unit 120 includes at least one displacement sensing element 122 (three of which are illustrated) and at least one pressure applying element 124 (three of which are illustrated). The displacement sensing element 122 is adapted to sense a relative displacement state of the substrate 70 and the flexible film 80 for determining a distribution of the crack front line R2. The pressure applying element 124 is adapted to apply a down pressing force to the substrate 70 and increase or decrease the down pressing force according to the relative displacement state, so as to adjust the distribution of the crack front line R2. In other embodiments, if the flexible film 80 is located above the substrate 70, the pressure applying element 124 may apply the down pressing force to the flexible film 80, which is not limited by the disclosure. In an embodiment, the separating device 100 provided by the embodiments of the disclosure may be applicable to a semiconductor package structure, a flexible display element structure, a flexible solar cell, and the like. The flexible film 80 is, for example, a base material of a semiconductor package structure, a flexible display element structure, a flexible solar cell, and the like.

Figure 2C:
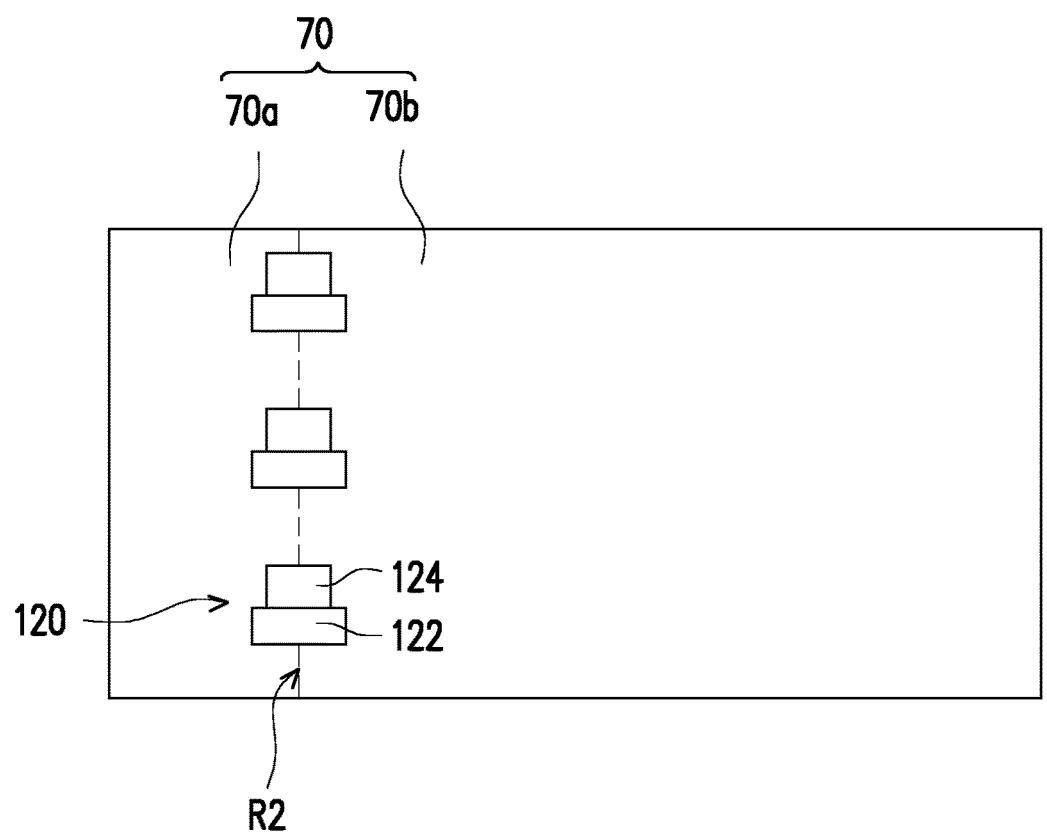
FIG. 2C illustrates the crack front line of FIG. 2A being adjusted to be similar to a straight line.

FIG. 2C illustrates the crack front line of FIG. 2A being adjusted to be similar to a straight line. As described above, the crack front line adjusting unit 120 of this embodiment may sense the relative displacement state of the substrate 70 and the flexible film 80 through the displacement sensing element 122 thereof for accordingly determining the distribution of the crack front line R2. In light of the above, according to the distribution of the crack front line R2, the crack front line adjusting unit 120 may suppress an excessively fast progress of generating the crack front line R2 in an area by applying a pressure to the substrate 70 through the pressure applying element 124, so as to adjust the crack front line R2 to be similar to a straight line as shown in FIG. 2C. As such, a uniform progress of separating the substrate 70 from the flexible film 80 may be achieved, a considerable warpage of the substrate 70 is prevented from being generated, and that the substrate 70 may provide favourable structural strength. For instance, a considerable weak total combining force between an edge of the flexible film 80 and the substrate 70 or an uneven thickness of the flexible film 80 or the substrate 70 generated during the manufacturing process may lead to excessively fast progress of generating the crack front line R2 in a local area.

In other embodiments, the crack front line adjusting unit 120 may suppress the excessively fast progress of generating the crack front line R2 in the area by applying a pressure to the flexible film 80 through the pressure applying element 124, and that the crack front line R2 is adjusted to be similar to a straight line shown in FIG. 2C.

Figure 3:
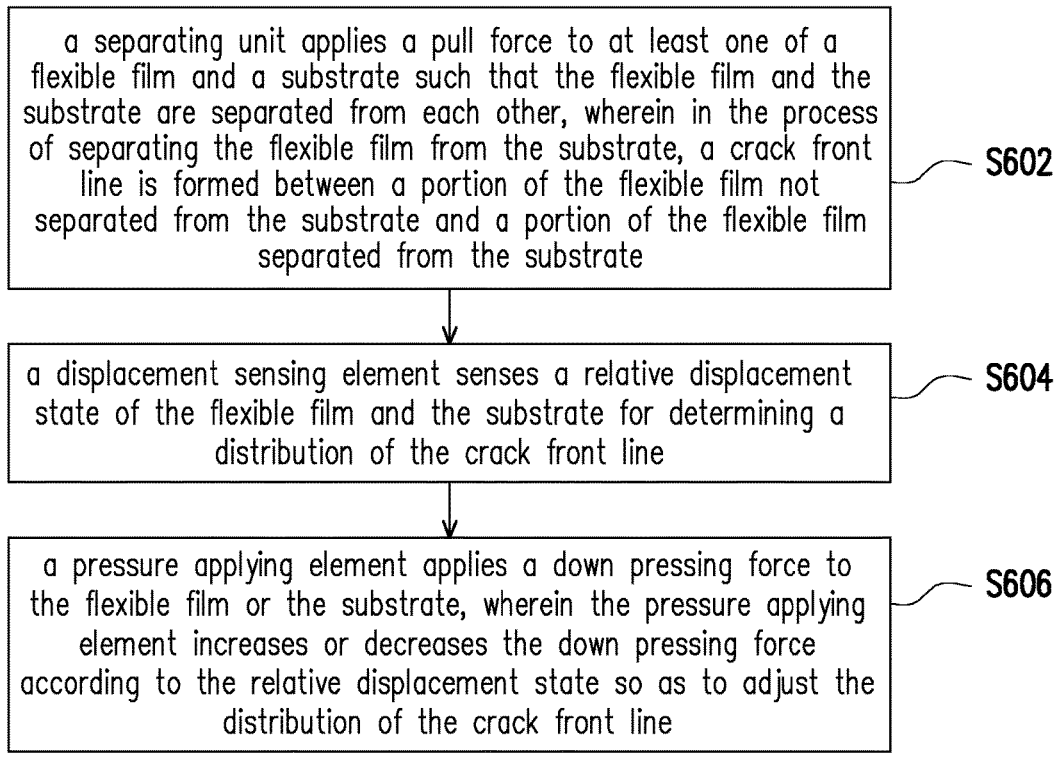
FIG. 3 is a flow chart of a separating method according to an embodiment of the disclosure.

A flow of a separating method performed by the separating device 100 is explained below with reference to the drawings. FIG. 3 is a flow chart of a separating method according to an embodiment of the disclosure. With reference to FIG. 3, first, the separating unit 110 applies a pull force to at least one of the substrate 70 and the flexible film 80, such that the substrate 70 and the flexible film 80 are separated from each other. During the process of separating the substrate 70 from the flexible film 80, the crack front line R2 is formed between the portion of the substrate 70 not separated from the flexible film 80 and the portion of the substrate 70 separated from the flexible film 80 (step S602). The displacement sensing element 122 senses the relative displacement state of the substrate 70 and the flexible film 80 for determining the distribution of the crack front line R2 (step S604). The pressure applying element 124 applies a down pressing force to the substrate 70 or the flexible film 80, wherein the pressure applying element 124 increases or decreases the down pressing force according to the relative displacement state, so as to adjust the distribution of the crack front line R2 (step S606).

In this embodiment, when the substrate 70 is not separated from the flexible film 80, a surface 72 of the substrate 70 is in contact with the flexible film 80. During the process of separating the substrate 70 from the flexible film 80, the separating unit 110 enables the crack front line R2 to move in a direction D1 parallel to the surface 72 through the pull force. The displacement sensing element 122 is, for example, an optical sensor and is adapted to sense the relative displacement state of the substrate 70 and the flexible film 80 in a direction D2 perpendicular to the surface 72. That is, the displacement sensing element 122 may sense a lift-off degree of the substrate 70 relative to the flexible film 80 in the direction D2 (shown in FIG. 2B) by means of optical distance measurement, so as to determine the distribution of the crack front line R2 in the direction D1. In other embodiments, the displacement sensing element 122 may be a sensor of another type, which is not limited by the disclosure.

In this embodiment, the pressure applying element 124 is slidably disposed at a track 126 through a sliding block 128 and thus may shift relative to the substrate 70 along the track 126 following a movement of the crack front line R2 when properly driven by a driving unit, so as to continuously adjust the crack front line R2. In addition, the displacement sensing element 122 and the pressure applying element 124 are connected and may move together. That is, the displacement sensing element 122 may shift relative to the substrate 70 as well following the movement of the crack front line R2, so as to obtain the distribution of the crack front line R2 through continuously sensing the substrate 70.

The pressure applying element 124 of this embodiment includes a pressure source 124a and a down pressing member 124b. The down pressing member 124b is connected to the pressure source 124a. The pressure source 124a is adapted to provide a pressure to the down pressing member 124b, so as to provide a down pressing force towards the substrate 70 and the flexible film 80 through the down pressing member 124b. The pressure source 124a may be a micro actuator, an air pressure cylinder, an air pressure valve, an electromagnetic valve, or other devices capable of providing a pressure, which is not limited by the disclosure. Besides, the down pressing member 124b is, for example, a roller and may roll on the substrate 70. The roller is a pressure applying element of a high-pressure type.

Figure 4:
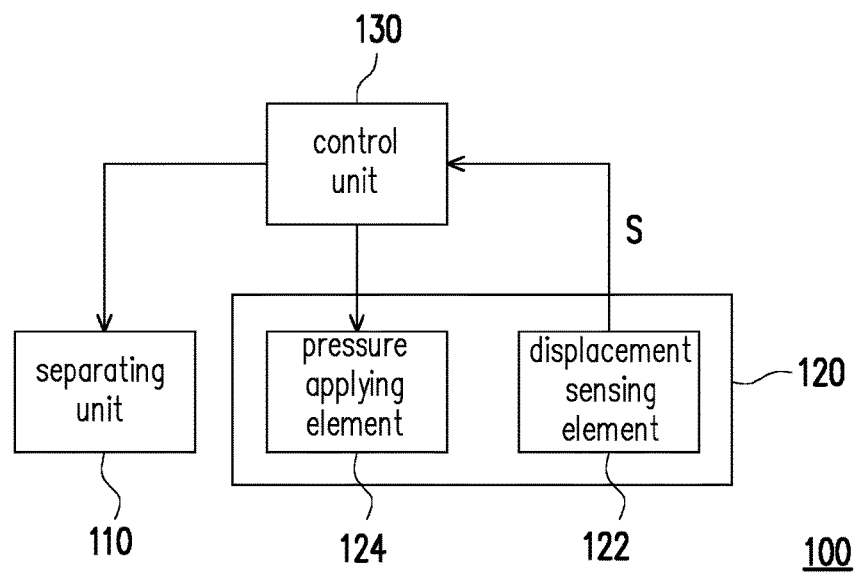
FIG. 4 is schematic block view of part of members of the separating device of FIG. 2B.

FIG. 4 is schematic block view of part of members of the separating device of 2B. With reference to FIG. 4, the separating device 100 of this embodiment includes a control unit 130. The separating unit 110 is coupled to the control unit 130, the displacement sensing element 122 is coupled to the control unit 130, and the pressure applying unit 124 is coupled to the control unit 130. That is, the separating unit 110, the displacement sensing element 122, and the pressure applying element 124 are all controlled by the control unit 130. The displacement sensing element 122 senses a sensing signal S of the relative displacement state of the substrate 70, and the control unit 130 controls the pressure applying element 124 according to the sensing signal S. Herein, in the process of controlling the separating unit 110 to continuously apply the pull force to the substrate 70 or the flexible film 80, the control unit 130 also controls a separating speed, and the separating unit 110 may speed up or stop the separation on the substrate 70 according to the sensing signal S corresponding to the relative displacement state. Note that only one crack front line adjusting unit 120 is illustrated in FIG. 4, but in fact, the three crack front line adjusting units 120 illustrated in FIG. 2A and FIG. 2C may be individually controlled by the same control unit 130. In addition, the disclosure is not intended to limit a number of the crack front line adjusting units 120. In other embodiments, the number of the crack front line adjusting units 120 may be other appropriate numbers as required (e.g., corresponding to sizes of the substrate 70 and the flexible film 80).

In this embodiment, the displacement sensing element 122 and the pressure applying element 124 are integrated into the crack front line adjusting unit 120. The sensing signal S is generated by the displacement sensing element 122 of the crack front line adjusting unit 120 and is fed back to the pressure applying element 124 of the crack front line adjusting unit 120 through the control unit 130. In other embodiments, the displacement sensing element 122 and the pressure applying element 124 may be disposed separately instead of being integrated, which is not limited by the disclosure.

Figure 5A:
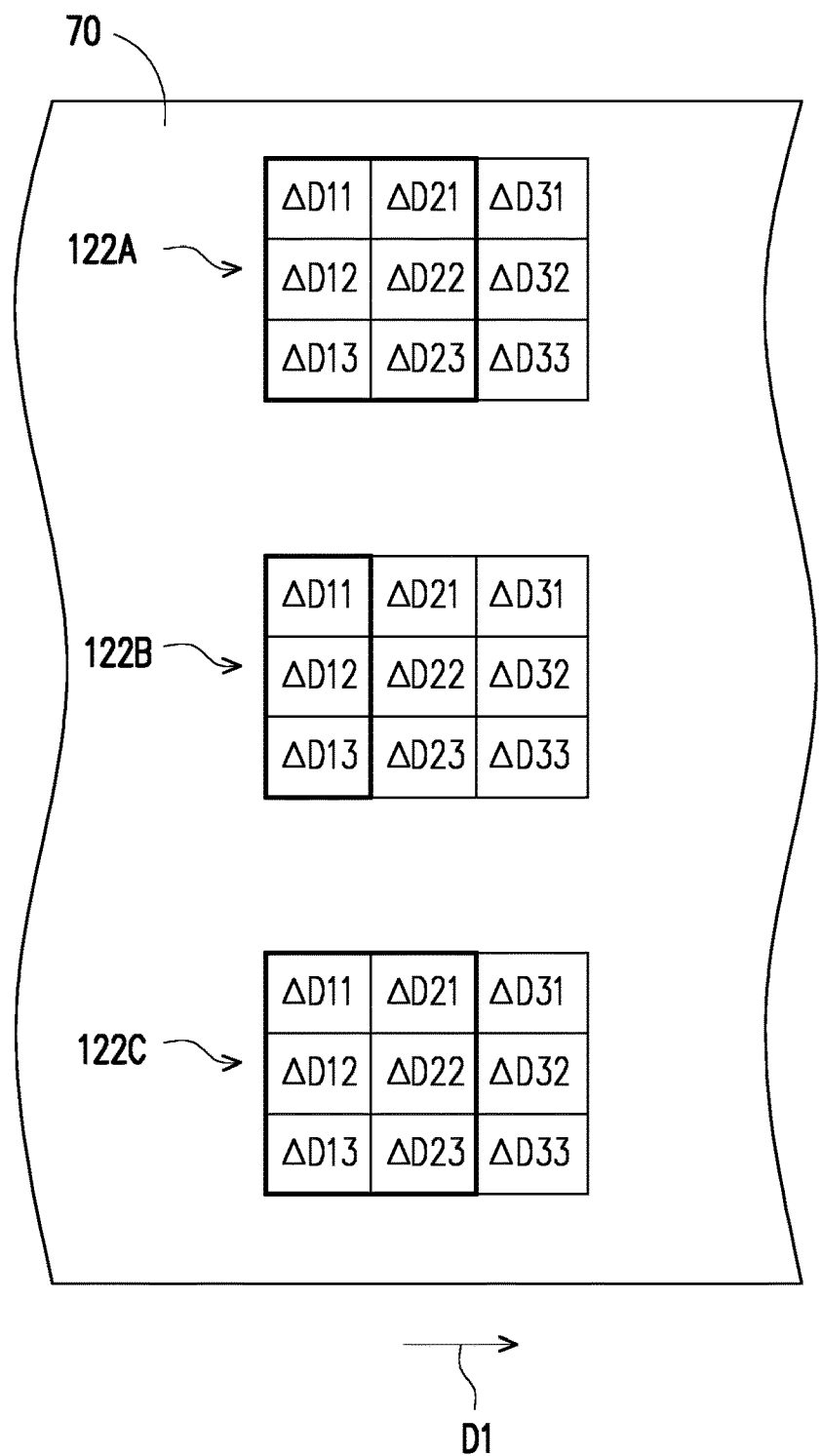
FIG. 5A to FIG. 5C are schematic diagrams of the flexible film and the displacement sensing element of FIG. 2A.
Figure 5B:
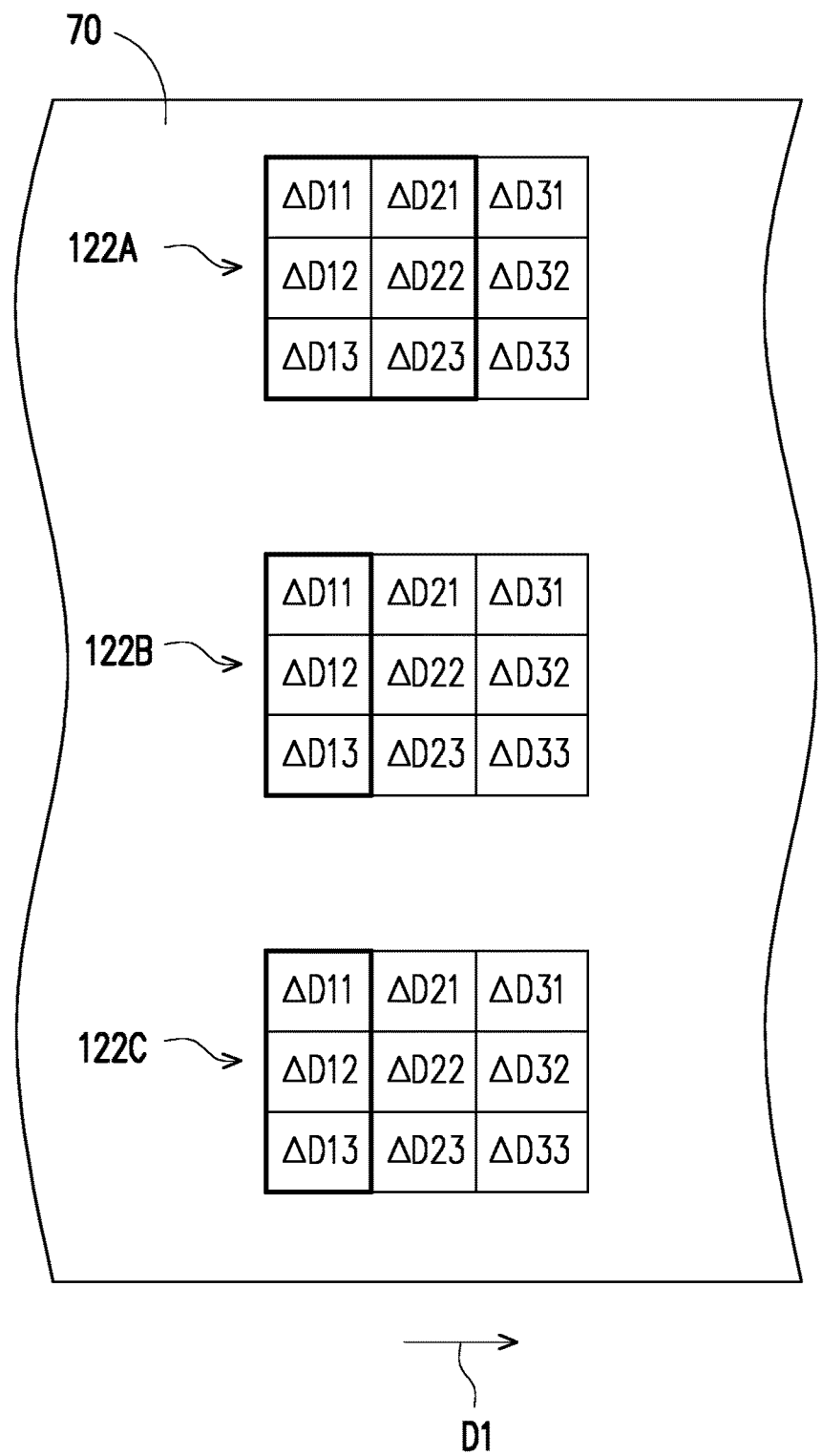
Figure 5C:
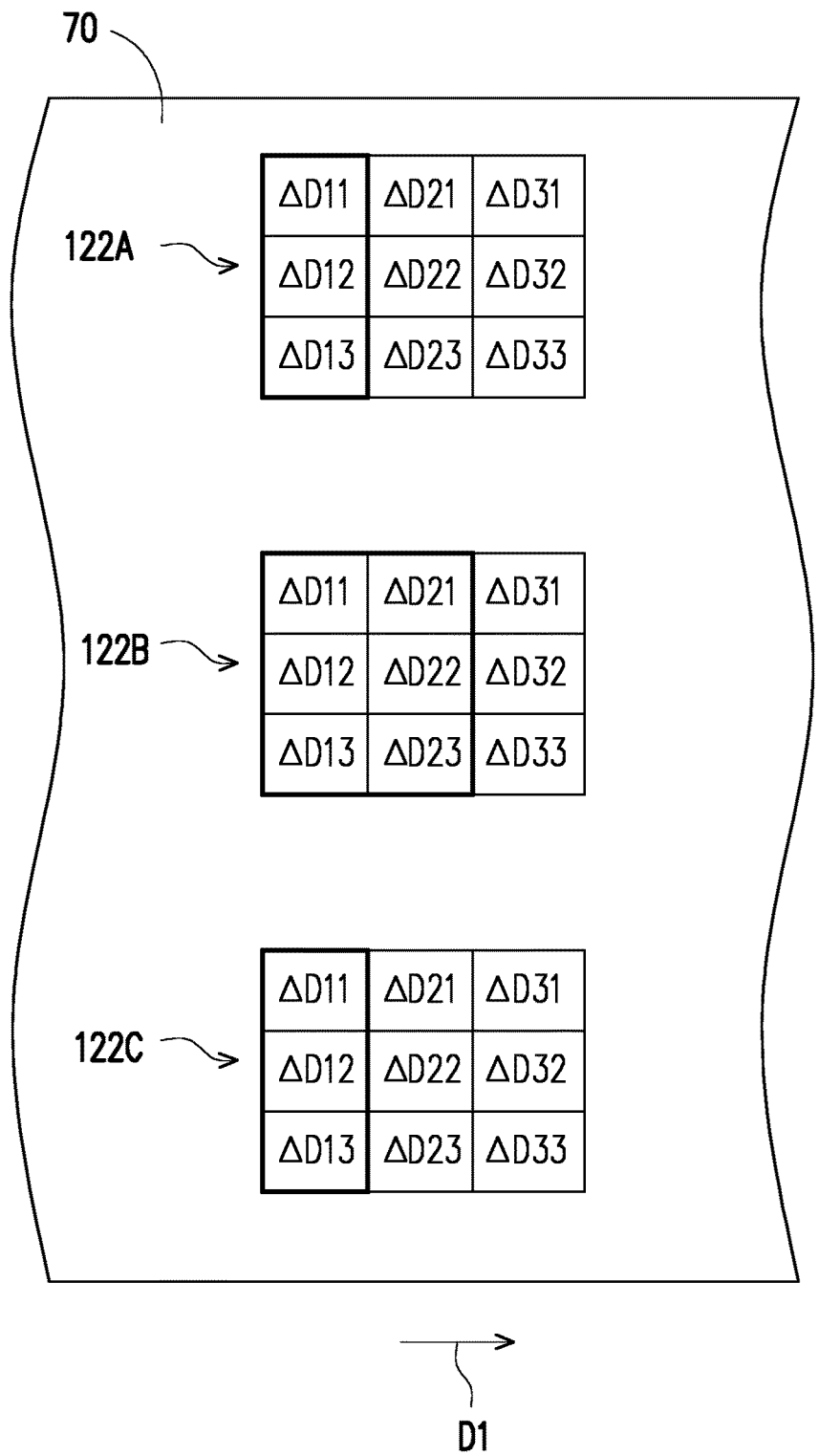

Detailed description of the sensing method of the displacement sensing element is described as follows. FIG. 5A to FIG. 5C are schematic diagrams of the flexible film and the displacement sensing element of FIG. 2A. In order to provide a clear illustration, reference numerals 122A, 122B, and 122C in FIG. 5A to FIG. 5C are used to respectively represent the three displacement sensing elements 122 in FIG. 2A. With reference to FIG. 5A to FIG. 5C, the displacement sensing elements 122A, 122B, and 122C of this embodiment respectively correspond to different areas of the substrate 70 and are adapted to sense a plurality of relative displacement amounts $\Delta D11$ to $\Delta D33$ of the substrate 70 and the flexible film 80 in a plurality of sub areas (nine sub areas are illustrated) in the corresponding areas. In terms of the corresponding sub area of the relative displacement amount $\Delta D11$ of one displacement sensing element 122, the displacement sensing element 122 may measure a distance between the substrate 70 and the displacement sensing element 122 at a first time point in this sub area. A distance between the substrate 70 and the displacement sensing element 122 at a second time point in this sub area is then measured. A difference value between the two distances is the relative displacement amount $\Delta D11$. If the flexible film 80 is regarded as not being displaced, the relative displacement amount $\Delta D11$ is the displacement of the substrate 70 relative to the flexible film 80 generated from the first time point to the second time point. The above explanation may also be applied to the relative displacement amounts $\Delta D12$ to $\Delta D33$, and that detailed descriptions are not further provided hereinafter.

As described above, the relative displacement state of the substrate 70 and the flexible film 80 is related to the relative displacement amounts $\Delta D11$ to $\Delta D33$ of the displacement sensing elements 122A, 122B, and 122C. Moreover, whether the relative displacement state is required to be adjusted may be determined according to a relationship between each of the relative displacement amounts $\Delta D11$ to $\Delta D33$ and a displacement threshold, as such, the down pressing force is further determined to be increased or decreased by the pressure applying unit 124. For instance, if values corresponding to the $\Delta D11$ to $\Delta D23$ of the displacement sensing element 122A, values corresponding to the $\Delta D11$ to $\Delta D13$ of the displacement sensing element 122B, and values corresponding to the $\Delta D11$ to $\Delta D23$ of the displacement sensing element 122C are all greater than a displacement threshold (i.e., the displacement amounts of the sub areas covered by the bold lines in FIG. 5A are greater than the threshold) and values corresponding to the $\Delta D31$ to $\Delta D33$ of the displacement sensing element 122A, values corresponding to the $\Delta D21$ to $\Delta D33$ of the displacement sensing element 122B, and values corresponding to the $D31$ to $\Delta D33$ of the displacement sensing element 122C are all less than the threshold, it means that the crack front line R2 (illustrated in FIG. 2A) is generated excessively fast in an area corresponding to the displacement sensing element 122A and in an area corresponding to the displacement sensing element 122C. At this time, the control unit 130 (illustrated in FIG. 3) determines that the relative displacement state in the area corresponding to the displacement sensing element 122A and in the area corresponding to the displacement sensing element 122C is required to be adjusted and accordingly controls the two pressure applying elements 124 corresponding to the displacement sensing element 122A and the displacement sensing element 122C to increase the down pressing force applied. As such, the control unit 130 may suppress the progress of generating the crack front line R2 in the area corresponding to the displacement sensing element 122A and in the area corresponding to the displacement sensing element 122C. In addition, if the values corresponding to the ΔD11 to ΔD23 of the displacement sensing element 122A, the values corresponding to the ΔD11 to ΔD13 of the displacement sensing element 122B, and values corresponding to the ΔD11 to ΔD13 of the displacement sensing element 122C are all greater than a displacement threshold (i.e., the displacement amounts of the sub areas covered by the bold lines in FIG. 5B are greater than the threshold) and the values corresponding to the ΔD31 to ΔD33 of the displacement sensing element 122A, the values corresponding to the ΔD21 to ΔD33 of the displacement sensing element 122B, and values corresponding to the D21 to ΔD33 of the displacement sensing element 122C are all less than the threshold, it means that the crack front line R2 is generated excessively fast in the area corresponding to the displacement sensing element 122A. At this time, the control unit 130 (illustrated in FIG. 3) determines that the relative displacement state in the area corresponding to the displacement sensing element 122A is required to be adjusted and accordingly controls the pressure applying element 124 corresponding to the displacement sensing element 122A to increase the down pressing force applied. As such, the control unit 130 may suppress the progress of generating the crack front line R2 in the area corresponding to the displacement sensing element 122A. Further, if values corresponding to the ΔD11 to ΔD13 of the displacement sensing element 122A, values corresponding to the ΔD11 to ΔD23 of the displacement sensing element 122B, and the values corresponding to the ΔD11 to ΔD13 of the displacement sensing element 122C are all greater than a displacement threshold (i.e., the displacement amounts of the sub areas covered by the bold lines in FIG. 5C are greater than the threshold) and values corresponding to the ΔD21 to ΔD33 of the displacement sensing element 122A, values corresponding to the ΔD31 to ΔD33 of the displacement sensing element 122B, and the values corresponding to the D21 to ΔD33 of the displacement sensing element 122C are all less than the threshold, it means that the crack front line R2 is generated excessively fast in the area corresponding to the displacement sensing element 122B. At this time, the control unit 130 (illustrated in FIG. 3) determines that the relative displacement state in the area corresponding to the displacement sensing element 122B is required to be adjusted and accordingly controls the pressure applying element 124 corresponding to the displacement sensing element 122B to increase the down pressing force applied. As such, the control unit 130 may suppress the progress of generating the crack front line R2 in the area corresponding to the displacement sensing element 122B. Other examples may be deduced by analogy. In other embodiments, other states of the relative displacement amounts ΔD11 to ΔD33 of the displacement sensing elements 122A, 122B, and 122C may be defined to be relative displacement states required to be adjusted, which is not limited by the disclosure.

Figure 6:
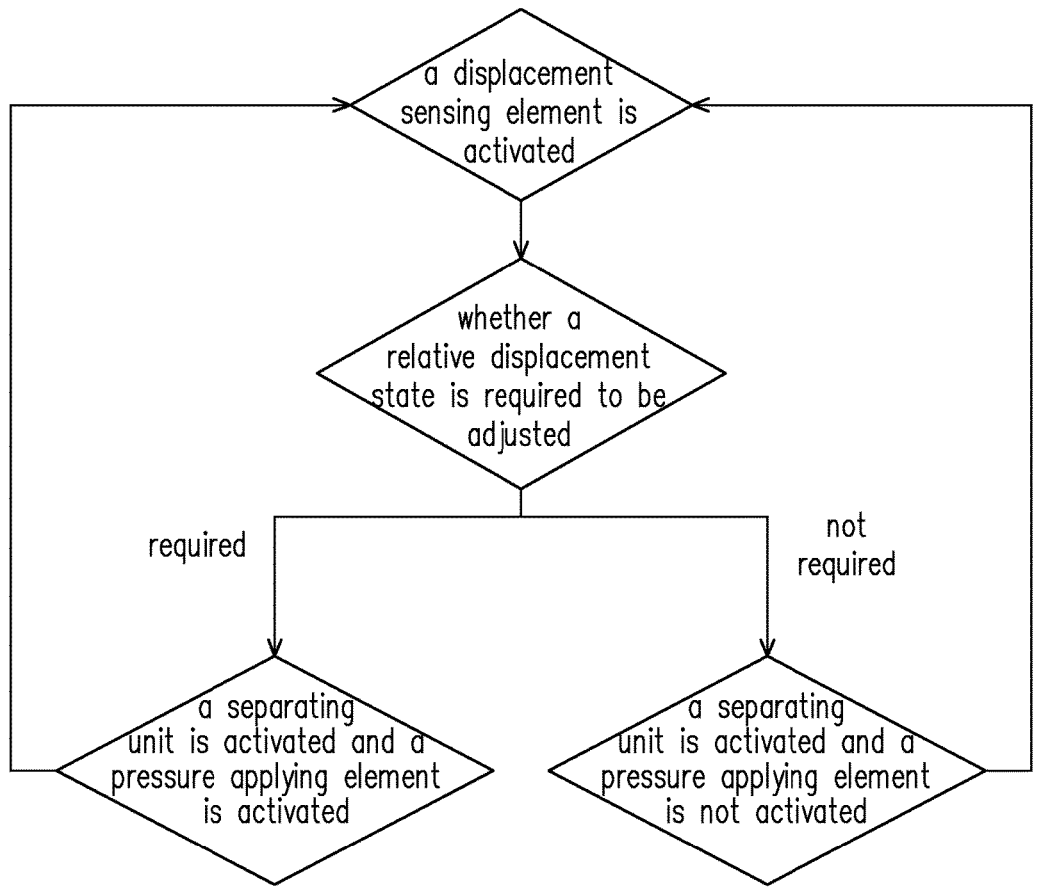
FIG. 6 illustrates a method of controlling the separating unit and the pressure applying element by the control unit of FIG. 4.

FIG. 6 illustrates a method of controlling the separating unit and the pressure applying element by the control unit of FIG. 4. With reference to FIG. 6, each of the displacement sensing elements 122 are activated to sense the relative displacement states of the substrate 70 and the flexible film 80 corresponding to each of positions of the displacement sensing elements 122. The control unit 130 determines that whether the relative displacement state corresponding to the position of each of the displacement sensing element 122 is required to be adjusted. If required, the separating unit 110 is activated to separate the substrate 70 from the flexible film 80, the corresponding pressure applying element 124 is activated to apply the down pressing force to the substrate 70 and the flexible film 80, and each of the displacement sensing elements 122 and the control unit 130 continuously perform the foregoing sensing and determining operations. If not required, the separating unit 110 is activated to separate the substrate 70 from the flexible film 80, the corresponding pressure applying element 124 is not activated, and the displacement sensing elements 122 and the control unit 130 continuously perform the foregoing sensing and determining operations. Note that FIG. 6 illustrates the flow of controlling the pressure applying element 124 of single crack front line adjusting unit 120 by the control unit 130, but in fact, the pressure applying elements 124 of the three crack front line adjusting units 120 shown in FIG. 2A to FIG. 2C may be individually controlled by the same control unit 130.

Figure 7:
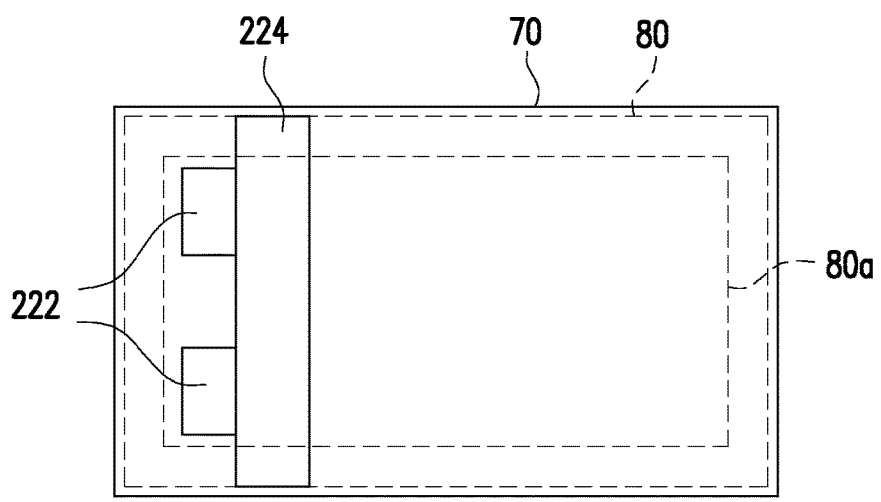
FIG. 7 is a schematic top view of separating a flexible film from a substrate by a separating device according to another embodiment of the disclosure.

FIG. 7 is a schematic top view of separating a flexible film from a substrate by a separating device according to another embodiment of the disclosure. A difference between the embodiment of FIG. 7 and the embodiment of FIG. 2A includes that a number of the pressure applying element 224 (including the roller) is one and a width of the pressure applying element 224 is greater than or equal to a width of an active area 80a of the flexible film 80, and a number of displacement sensing elements 222 is two and the displacement sensing elements 222 are connected to a back side of the pressure applying element 224. The number of the pressure applying element 224 may be plural in other embodiments.

Figure 8A:
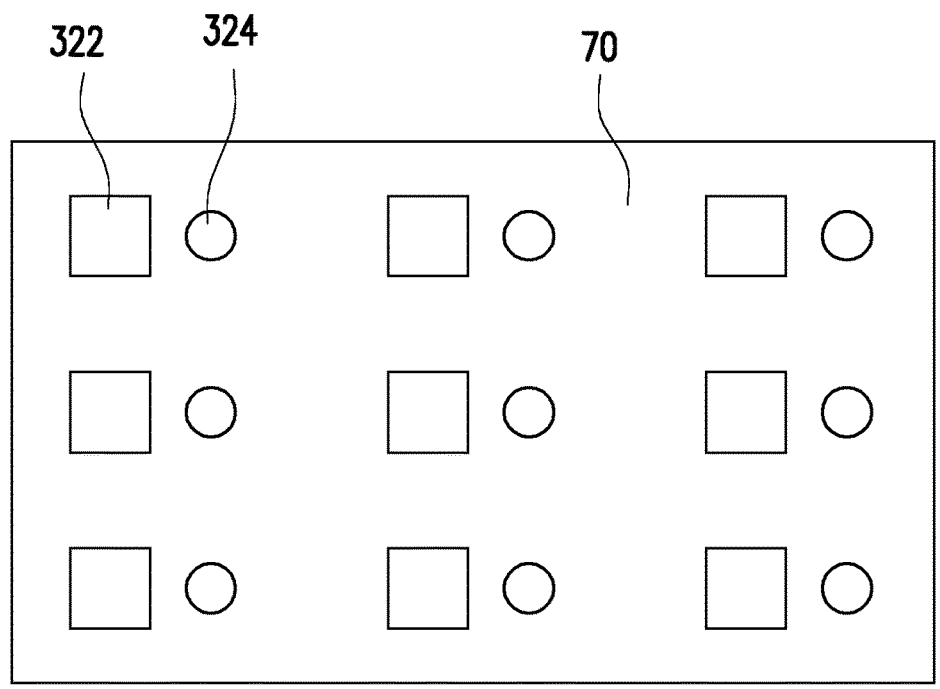
FIG. 8A is a schematic top view of separating a flexible film from a substrate by a separating device according to another embodiment of the disclosure.
Figure 8B:
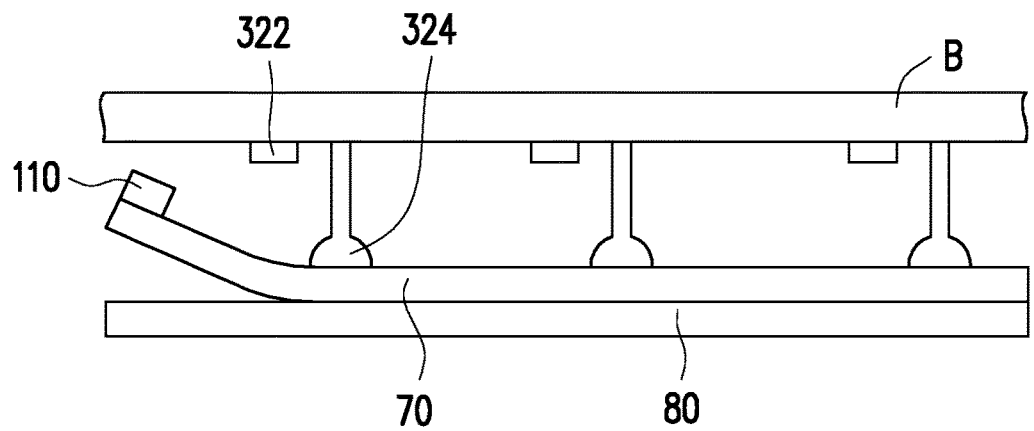
FIG. 8B is a schematic side view of the separating device, the flexible film, and the substrate of FIG. 8A.

FIG. 8A is a schematic top view of separating a flexible film from a substrate by a separating device according to another embodiment of the disclosure. FIG. 8B is a schematic side view of the separating device, the flexible film, and the substrate of FIG. 8A. In order to have a clearer figure, only part of members of the separating device of FIG. 8B are illustrated in FIG. 8A. A difference between the embodiment illustrated in FIG. 8A and FIG. 8B and the embodiment illustrated in FIG. 2A and FIG. 2B includes that pressure applying elements 324 include suckers, have a greater number, are fixed to a fixing base B, and are evenly distributed above the substrate 70 and the flexible film 80, and displacement sensing elements 322 also have a greater number, are fixed to the fixing base B, and are evenly distributed above the substrate 70 and the flexible film 80. The suckers are pressure applying elements of a pneumatic type. Since the pressure applying elements 324 and the displacement sensing elements 322 are evenly distributed above the substrate 70 and the flexible film 80, the pressure applying elements 324 and the displacement sensing elements 322 may completely sense the substrate 70 without moving. In this embodiment, the pressure applying elements 324 may move upwards in sequence as the substrate 70 and the flexible film 80 are separated from each other from left to right, as such, the substrate 70 may be smoothly moved away from the flexible film 80.

Figure 9A:
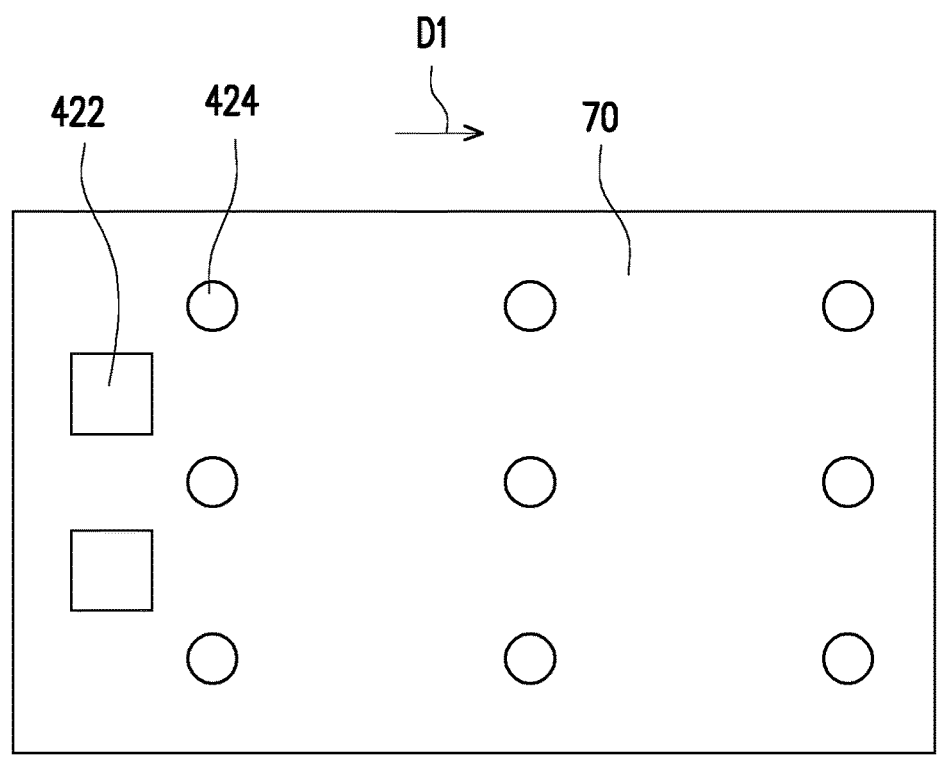
FIG. 9A is a schematic top view of separating a flexible film from a substrate by a separating device according to another embodiment of the disclosure.
Figure 9B:
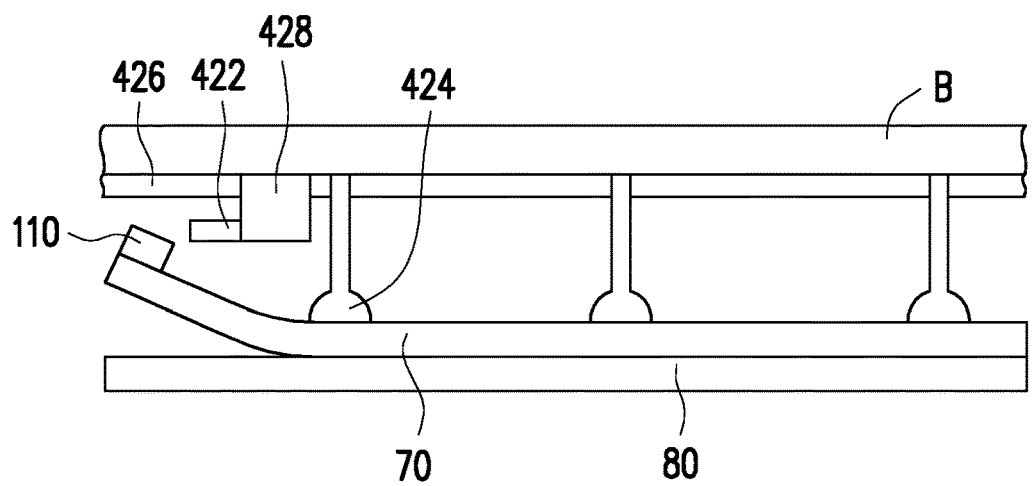
FIG. 9B is a schematic side view of the separating device, the flexible film, and the substrate of FIG. 9A.

FIG. 9A is a schematic top view of separating a flexible film from a substrate by a separating device according to another embodiment of the disclosure. FIG. 9B is a schematic side view of the separating device, the flexible film, and the substrate of FIG. 9A. In order to have a clearer figure, only part of members of the separating device of FIG. 9B are illustrated in FIG. 9A. A difference between the embodiment illustrated in FIG. 9A and FIG. 9B and the embodiment illustrated in FIG. 8A and FIG. 8B includes that a number of displacement sensing elements 422 is at least two, and the displacement sensing elements 422 are unevenly distributed above the substrate 70 and the flexible film 80. The displacement sensing element 422 is fixed to a sliding block 428, and the sliding block 428 is slidably disposed at a track 426. As such, the displacement sensing element 422 may shift relative to the substrate 70 and the pressure applying element 424 in the direction D1 along with the movement of the crack front line for obtaining the distribution of the crack front line through continuously sensing the substrate 70.

Figure 10:
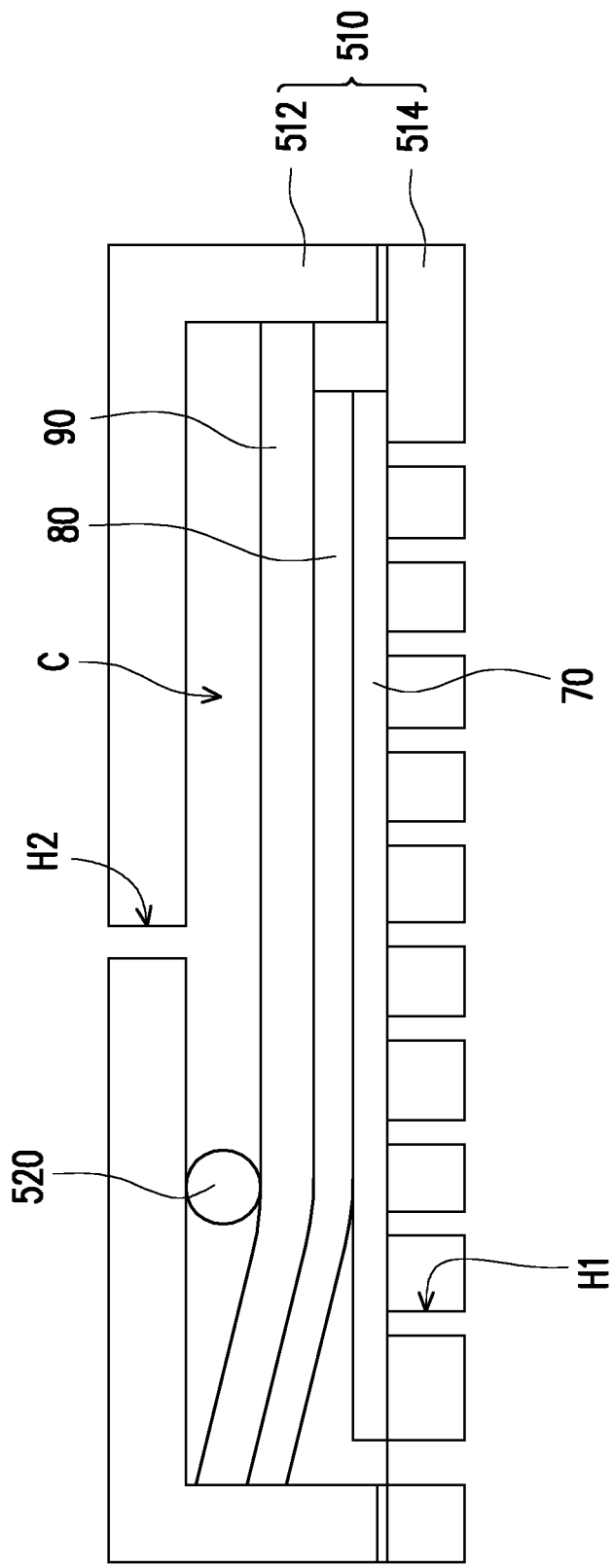
FIG. 10 is a schematic side view of separating a flexible film from a substrate by a separating device according to another embodiment of the disclosure.

FIG. 10 is a schematic side view of separating a flexible film from a substrate by a separating device according to another embodiment of the disclosure. A difference between the embodiment of FIG. 10 and the embodiment of FIG. 2B includes that a separating unit 510 includes a vacuum chamber C and provides the pull force through vacuum pumping. The details are described as follows. The separating unit 510 includes an upper platform 512 and a lower platform 514 combined with each other. The substrate 70 and the flexible film 80 are located in an accommodation space between the upper platform 512 and the lower platform 514. The lower platform 514 has an opening hole H1 and thus may apply a suction force to the substrate 70 through the opening hole H1. A deformable sucker 90 is attached to the flexible film 80. The upper platform 512 has an opening hole H2 and thus may apply a suction force to the sucker 90 through the opening hole H2, as such, the substrate 70 and the flexible film 80 can be separated from each other. FIG. 10 only schematically illustrates a crack front line adjusting unit 520. The crack front line adjusting unit 520 is located in the accommodating space and adjusts the crack front line between the substrate 70 and the flexible film 80. The crack front line adjusting unit 520 is disposed and operated in a manner similar to the crack front line adjusting unit described in the foregoing embodiment. Thus, details thereof are not repeated hereinafter. Similar to the effect which may be achieved by the crack front line adjusting unit of the foregoing embodiment, the crack front line adjusting unit 520 of this embodiment may sense the relative displacement state of the substrate 70 and the flexible film 80 through a displacement sensing element thereof for accordingly determining the distribution of the crack front line. In view of the foregoing, according to the distribution of the crack front line, the crack front line adjusting unit 520 may suppress the excessively fast progress of generating the crack front line in an area by applying a pressure to the substrate 70 through the pressure applying element thereof, so as to adjust the crack front line to be similar to a straight line. As such, a uniform progress of separating the substrate 70 from the flexible film 80 may be achieved, a considerable warpage of the substrate 70 is prevented from being generated, and that the substrate 70 may provide favourable structural strength.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. A separating device, adapted to separate a flexible film from a substrate, the separating device comprising:
   a separating mechanism, adapted to pull at least one of the flexible film and the substrate such that the flexible film and the substrate are separated from each other, wherein a crack front line is formed between a portion of the flexible film separated from the substrate and a portion of the flexible film not separated from the substrate during the process of separating the flexible film from the substrate; and
   a crack front line adjusting unit, comprising at least one displacement sensing element and at least one pressure applying element, wherein the at least one displacement sensing element is adapted to sense a relative displacement state of the flexible film and the substrate for determining a distribution of the crack front line, and the at least one pressure applying element is adapted to apply a down pressing force to the flexible film or the substrate and increase or decrease the down pressing force according to the relative displacement state so as to adjust the distribution of the crack front line.

2. The separating device as claimed in claim 1, comprising a control unit, wherein the separating mechanism is coupled to the control unit, the at least one displacement sensing element is coupled to the control unit, the at least one pressure applying unit is coupled to the control unit, the at least one displacement sensing element is adapted to generate a sensing signal corresponding to the relative displacement state, and the control unit is adapted to control the at least one pressure applying element and the separating mechanism according to the sensing signal.

3. The separating device as claimed in claim 1, wherein the at least one displacement sensing element comprises a plurality of displacement sensing elements, the at least one pressure applying element comprises a plurality of pressure applying elements, and the displacement sensing elements and the pressure applying elements are evenly distributed above the substrate and the flexible film.

4. The separating device as claimed in claim 3, wherein the at least one pressure applying element comprises a plurality of pressure applying elements, the pressure applying elements are evenly distributed above the substrate and the flexible film, and the at least one displacement sensing element is able to shift relative to the substrate and the pressure applying elements.

5. The separating device as claimed in claim 1, wherein the separating mechanism comprises a vacuum chamber.

6. The separating device as claimed in claim 1, wherein the at least one pressure applying element comprises a pressure source and a down pressing member, the down pressing member is connected to the pressure source, and the pressure source is adapted to provide a pressing force to the down pressing member so as to apply the down pressing force towards the flexible film and the substrate through the down pressing member.

7. The separating device as claimed in claim 1, wherein the at least one pressure applying element is adapted to shift relative to the substrate along with a movement of the crack front line.

8. The separating device as claimed in claim 1, wherein the at least one displacement sensing element is adapted to shift relative to the substrate along with a movement of the crack front line.

9. The separating device as claimed in claim 1, wherein the at least one pressure applying element comprises a roller or a sucker.

10. A separating method, adapted to separate a flexible film from a substrate, the separating method comprising:
applying a pull force to at least one of the flexible film and the substrate through a separating mechanism such that the flexible film and the substrate are separated from each other, wherein a crack front line is formed between a portion of the flexible film not separated from the substrate and a portion of the flexible film separated from the substrate during the process of separating the flexible film from the substrate;
sensing a plurality of relative displacement amounts of the flexible film and a plurality of sub areas of the substrate for determining a distribution of the crack front line through at least one displacement sensing element; and
applying a down pressing force to the flexible film or the substrate through at least one pressure applying element, wherein the at least one pressure applying element increases or decreases the down pressing force according to whether each of the relative displacement amounts is greater than a displacement threshold to adjust the distribution of the crack front line.

11. The separating method as claimed in claim 10, comprising:
generating a sensing signal corresponding to the relative displacement amounts through the at least one displacement sensing element; and
controlling the at least one pressure applying element and the separating mechanism according to the sensing signal through a control unit.

12. The separating method as claimed in claim 10, wherein a surface of the substrate is in contact with the flexible film when the flexible film and the substrate are not separated from each other, and the separating method comprises:
moving the crack front line in a direction parallel to the surface through the pull force by the separating mechanism during the process of separating the flexible film from the substrate; and
sensing the relative displacement amounts of the flexible film and the substrate in a direction perpendicular to the surface through the at least one displacement sensing element.

13. The separating method as claimed in claim 10, comprising:
applying or stopping applying the pull force by the separating mechanism according to whether each of the relative displacement amounts is greater than the displacement threshold.

14. The separating method as claimed in claim 10, wherein the at least one pressure applying element comprises a pressure source and a down pressing member, and the separating method comprises:
providing a pressing force to the down pressing member through the pressure source so as to apply the down pressing force towards the flexible film and the substrate through the down pressing member.

15. The separating method as claimed in claim 10, comprising:
driving the at least one pressure applying element to shift relative to the substrate along with a movement of the crack front line.

16. The separating method as claimed in claim 10, comprising:
driving the at least one displacement sensing element to shift relative to the substrate along with a movement of the crack front line.

17. The separating method as claimed in claim 10, comprising:
driving the at least one displacement sensing element to move together with the at least one pressure applying element.

* * * * *